(12) United States Patent
Hussell

(10) Patent No.: US 11,101,410 B2
(45) Date of Patent: Aug. 24, 2021

(54) LED SYSTEMS, APPARATUSES, AND METHODS

(71) Applicant: Cree, Inc., Durham, NC (US)

(72) Inventor: Christopher P. Hussell, Cary, NC (US)

(73) Assignee: CreeLED, Inc., Newark, CA (US)

( * ) Notice: Subject to any disclaimer, the term of this patent is extended or adjusted under 35 U.S.C. 154(b) by 0 days.

(21) Appl. No.: 15/997,350

(22) Filed: Jun. 4, 2018

(65) Prior Publication Data
US 2019/0371974 A1     Dec. 5, 2019

Related U.S. Application Data

(63) Continuation-in-part of application No. 15/993,540, filed on May 30, 2018, now Pat. No. 10,453,827.

(51) Int. Cl.
*H01L 33/50*     (2010.01)
*G09G 3/32*     (2016.01)
(Continued)

(52) U.S. Cl.
CPC .............. *H01L 33/502* (2013.01); *G09G 3/32* (2013.01); *H01L 27/322* (2013.01);
(Continued)

(58) Field of Classification Search
None
See application file for complete search history.

(56) References Cited

U.S. PATENT DOCUMENTS

| 4,918,497 A | 4/1990 | Edmond |
|---|---|---|
| 4,966,862 A | 10/1990 | Edmond |
| (Continued) | | |

FOREIGN PATENT DOCUMENTS

| CA | 2 936 473 A1 | 1/2018 |
|---|---|---|
| EP | 3 364 458 A1 | 8/2018 |
| (Continued) | | |

OTHER PUBLICATIONS

Notice of Allowance for Application No. 15/993,540 dated Jun. 13, 2019.
(Continued)

*Primary Examiner* — Michelle Mandala
(74) *Attorney, Agent, or Firm* — Jenkins, Wilson, Taylor & Hunt, P.A.

(57) ABSTRACT

Light emitting diode (LED) devices and systems include a superstrate (e.g., a light-transmissive layer), at least one region of wavelength-conversion material in the light-transmissive layer, and LEDs attached to the superstrate at the location of the wavelength-conversion material. An encapsulant layer is formed over and/or around the LEDs with an opaque or clear material. Additional color filter layers are optionally applied to the light-transmissive layer. A method for producing LED devices and systems includes providing a superstrate with a wavelength-conversion material region formed therein, attaching LEDs to the superstrate at the die-attach layer, forming conductive surfaces on a side of the LED opposite the die-attach layer, dispensing an encapsulant layer to at least partially encapsulate the LEDs, and forming one or more electrical traces to electrically interconnect the conductive surfaces of at least some of the LEDs with each other.

35 Claims, 13 Drawing Sheets

(51) Int. Cl.
*H01L 33/62* (2010.01)
*H01L 27/32* (2006.01)
*H01L 33/52* (2010.01)

(52) U.S. Cl.
CPC .......... *H01L 27/3241* (2013.01); *H01L 33/52* (2013.01); *H01L 33/62* (2013.01)

(56) References Cited

U.S. PATENT DOCUMENTS

| | | |
|---|---|---|
| 5,027,168 A | 6/1991 | Edmond |
| 5,210,051 A | 5/1993 | Carter, Jr. |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 5,952,681 A * | 9/1999 | Chen ............... H01L 27/153 257/88 |
| 6,120,600 A | 9/2000 | Edmond et al. |
| 6,187,606 B1 | 2/2001 | Edmond et al. |
| 6,201,262 B1 | 3/2001 | Edmond et al. |
| 6,600,175 B1 | 7/2003 | Baretz et al. |
| 6,791,119 B2 | 9/2004 | Slater, Jr. et al. |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,456,499 B2 | 11/2008 | Loh et al. |
| 7,564,180 B2 | 7/2009 | Brandes |
| 7,655,957 B2 | 2/2010 | Loh et al. |
| 7,802,901 B2 | 9/2010 | McMillan |
| 7,821,023 B2 | 10/2010 | Yuan et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van De Ven et al. |
| 8,044,418 B2 | 10/2011 | Loh et al. |
| 8,125,137 B2 | 2/2012 | Medendorp, Jr. et al. |
| 8,264,138 B2 | 9/2012 | Negley et al. |
| 8,337,071 B2 | 12/2012 | Negley et al. |
| 8,563,339 B2 | 10/2013 | Tarsa et al. |
| 8,729,589 B2 | 5/2014 | Hussell et al. |
| 8,866,410 B2 | 10/2014 | Negley et al. |
| 8,970,131 B2 | 3/2015 | Brandes et al. |
| 9,024,349 B2 | 5/2015 | Chitnis et al. |
| 9,054,257 B2 | 6/2015 | Chan et al. |
| 9,131,561 B2 | 9/2015 | Athalye |
| 9,159,888 B2 | 10/2015 | Chitnis et al. |
| 9,277,605 B2 | 3/2016 | Ni |
| 9,414,454 B2 | 8/2016 | Brandes et al. |
| 9,713,211 B2 | 7/2017 | Van De Ven et al. |
| 10,453,827 B1 * | 10/2019 | Hussell ............... H01L 33/52 |
| 2005/0035356 A1 | 2/2005 | Kek et al. |
| 2006/0221272 A1 | 10/2006 | Negley et al. |
| 2007/0104828 A1 | 5/2007 | Fornaguera |
| 2009/0050908 A1 | 2/2009 | Yuan et al. |
| 2009/0230409 A1 | 9/2009 | Basin et al. |
| 2010/0140655 A1 | 6/2010 | Shi |
| 2010/0295079 A1 * | 11/2010 | Melman ............... H01L 33/50 257/98 |
| 2011/0176301 A1 | 7/2011 | Liang et al. |
| 2012/0217147 A1 * | 8/2012 | Porter ............... H03K 17/962 200/600 |
| 2012/0248469 A1 | 10/2012 | Choi |
| 2013/0026520 A1 | 1/2013 | Hu et al. |
| 2013/0069525 A1 | 3/2013 | Imai |
| 2013/0093313 A1 | 4/2013 | Oyamada |
| 2014/0042467 A1 | 2/2014 | Livesay et al. |
| 2014/0191272 A1 * | 7/2014 | Jerebic ............... H01L 33/60 257/98 |
| 2014/0346545 A1 | 11/2014 | Chan et al. |
| 2015/0001563 A1 * | 1/2015 | Miki ............... H01L 33/54 257/98 |
| 2015/0171290 A1 * | 6/2015 | Lee ............... H01L 33/62 257/13 |
| 2015/0249069 A1 | 9/2015 | Yoshida et al. |
| 2015/0257211 A1 | 9/2015 | Johnson et al. |
| 2015/0287892 A1 | 10/2015 | Han et al. |
| 2015/0371585 A1 | 12/2015 | Bower et al. |
| 2016/0027973 A1 | 1/2016 | Maki |
| 2016/0329376 A1 * | 11/2016 | Kim ............... H01L 27/156 |
| 2016/0351539 A1 | 12/2016 | Bower et al. |
| 2017/0062681 A1 | 3/2017 | Miyoshi et al. |
| 2017/0092820 A1 * | 3/2017 | Kim ............... H01L 33/32 |
| 2017/0294418 A1 | 10/2017 | Edmond et al. |
| 2017/0358624 A1 | 12/2017 | Takeya et al. |
| 2018/0341152 A1 * | 11/2018 | Yamashita ......... G02F 1/133611 |
| 2018/0351048 A1 * | 12/2018 | Sogai ............... H01L 33/50 |
| 2019/0018287 A1 * | 1/2019 | Luchinger ......... G02F 1/133514 |
| 2019/0212610 A1 * | 7/2019 | Kim .................. G02F 1/136286 |

FOREIGN PATENT DOCUMENTS

| | | |
|---|---|---|
| TW | 201 214 795 A | 4/2012 |
| WO | WO 2019/231843 A1 | 12/2019 |
| WO | WO 2019/236325 A1 | 12/2019 |

OTHER PUBLICATIONS

Non-Final Office Action for U.S. Appl. No. 15/993,540 dated Feb. 21, 2019.
International Search Report and Written Opinion for Application No. PCT/US2019/033919 dated Oct. 29, 2019.
Invitation to Pay Additional Fees and Search Report for International Application No. PCT/US2019/033919 dated Sep. 5, 2019.
International Search Report and Written Opinion for Application No. PCT/US2019/033914 dated Sep. 5, 2019.
Taiwan Office Action for Application No. 108118486 dated May 26, 2020.
Taiwan Office Action for Application No. 108118486 dated Oct. 20, 2020.

* cited by examiner

LED SYSTEMS, APPARATUSES, AND METHODS

This application is a continuation-in-part from and claims priority to U.S. patent application Ser. No. 15/993,540, filed on May 30, 2018, the disclosure of which is incorporated by reference herein in the entirety.

TECHNICAL FIELD

The present subject matter relates generally to light emitting devices, systems, and/or methods. More particularly, the subject matter disclosed herein relates to color filters for LEDs.

BACKGROUND

Light emitting diodes or "LEDs" are solid state devices that convert electrical energy into light. LEDs can be utilized in light emitter devices or components for providing different colors and patterns of light useful in various lighting, display, and optoelectronic applications. One such application is the use of LEDs in video screens. LED video displays typically comprise arrays of red, green, and blue LEDs mounted on a single electronic device attached to a printed circuit board (PCB) that controls the output of each electronic device.

Conventional LED arrays often have a transparent encapsulant covering the individual LEDs to protect the devices and maximize the efficiency of the devices. When used in applications such as video screens, it may be additionally desirable to reduce and/or enhance the amount of reflected light. Controlling the amount of reflected light can provide benefits such as increased contrast, image sharpness, and consistent color quality across viewing angles.

Additionally, a known problem with LED arrays is color quality in the far field. Individual LEDs in a grouped array may have different light output profiles, which become more apparent when seen from a wide viewing angle. For example, some colors of LEDs can have wider light output cones and thus dominate the overall color tone at the extents of the viewing region, resulting in undesirable color quality.

Hence, there is a continuing need for improvements to encapsulated LED arrays while consideration is also given to cost. For example, some colors of LEDs can be more expensive to produce than others.

SUMMARY

In some aspects, a light emitting diode (LED) apparatus can have a light-transmissive layer and one or more regions of a wavelength-conversion material disposed in at least a portion of a first side of the light-transmissive layer. One or more LEDs can be disposed on the light-transmissive layer such that light emitted from one or more LEDs can pass through the wavelength-conversion material, and an opaque encapsulant can be disposed around and between the one or more LEDs.

In other aspects, a method of producing a light-emitting diode apparatus can comprise providing a light-transmissive layer, disposing a wavelength-conversion material in at least a portion of the light-transmissive layer, attaching one or more LEDs to a first side of the light-transmissive layer such that light emitted from one or more LEDs can pass through the wavelength-conversion material, and subsequently applying an opaque encapsulant surrounding the one or more LEDs.

In further aspects, a light emitting diode (LED) apparatus can include a light-transmissive layer and one or more regions of a color-filtering material disposed on at least one side of the light-transmissive layer. One or more LEDs can be disposed on the light-transmissive layer such that light emitted from one or more LEDs can pass through the color-filtering material, and an opaque encapsulant can be disposed around and between the one or more LEDs.

A multi-color LED device as disclosed herein can have several benefits over conventional multi-color LED devices. By combining LEDs with additional features such as phosphor conversion material and color filtering layers, a lower cost device with better far field and less pixilation can be constructed.

Lower cost can be achieved by replacing more expensive LEDs (for example, red) with less expensive die colors (such as blue and optionally green). Multi-color LED devices can be constructed through the use of wavelength-conversion layers in combination with color filtering layers on light-emitting surfaces, which can produce colors not provided by the LEDs. For example, the wavelength of blue and/or green LEDs can be altered to produce longer-wavelength colors such as red. Additionally, the consolidation of parts can reduce costs and streamline the manufacturing process.

The use of a phosphor layer can also improve the far field due to the naturally non-directional emission from the phosphor. This can reduce color-shifting that is sometimes observable when viewing a video screen at a wide angle.

"Screen door effect", or SDE, is another problem which can occur in LED video displays. SDE occurs when a light source is observably smaller than the screen "pitch" (i.e., the grid of pixels, where each pixel is a multi-color LED array). This phenomenon can occur in many types of video displays, but it is often particularly visible in LED screens. Phosphors, diffusers, and other color-filtering layers as disclosed herein can be used to reduce SDE by spreading the light of the source within the component to fill out the space or "gaps" between the arrays in the grid, while maintaining individual color quality.

BRIEF DESCRIPTION OF THE DRAWINGS

A full and enabling disclosure of the present subject matter is set forth more particularly in the remainder of the specification, including reference to the accompanying figures, relating to one or more embodiments, in which.

DETAILED DESCRIPTION

Figure 1:
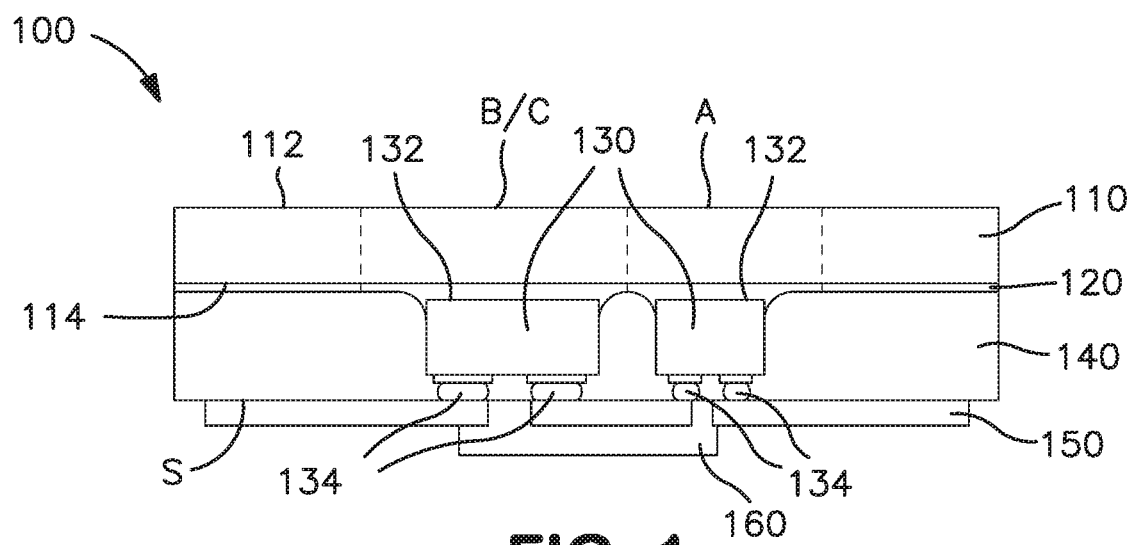
FIG. 1 is a cross-sectional side view of an LED apparatus according to the disclosure herein.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects, scope, or embodiments set forth herein, but are to include deviations in shapes. These deviations may result, for example, from manufacturing. In the drawings, the size and relative sizes of layers and regions can be exaggerated for clarity. The actual thickness of the layers can be different from the shapes of the illustrations. A region illustrated or described as square or rectangular will typically have rounded or curved features due to normal manufacturing tolerances. Thus, the regions illustrated in the figures are schematic in nature and their shapes are not intended to illustrate the precise shape of a region of a device.

Unless the absence of one or more elements is specifically recited, the terms "comprising", "including", and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common cathode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

The term "opaque" refers to materials, surfaces, etc. that are either not transparent or are non-light transmitting over at least a portion of the visible light spectrum. "Opaque" can also apply to the entire visible light spectrum. The term "non-light transmitting" is considered as transmitting less than 30% of a received light. A material can further be opaque due to either light absorption or light reflection. A white material, for example, can be opaque and reflective. Some materials can be opaque at certain wavelengths and transparent at others. As a non-limiting example, a red pigment may act as a color filter by absorbing light wavelengths below approximately 600 nm, where it is opaque, while transmitting light wavelengths above approximately 600 nm, where it is transparent.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic or metal boards having FR4 and/or electrical traces arranged on one or multiple surfaces thereof, high reflectivity ceramics (e.g., alumina) support panels, transparent or light-transmitting materials (e.g., glass, plastic, sapphire), and/or mounting elements of various materials and conformations arranged to receive, support, and/or conduct electrical power to solid state emitters. Electrical traces described herein provide electrical power to the emitters for electrically activating and illuminating the emitters. Electrical traces may be opaque or transparent, and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (with or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by dispensing, printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted significantly by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the device upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device. A light-emitting apparatus as used herein can further be used not only for illuminating an object or an area, but also for direct viewing of the apparatus (e.g., LED video displays). Phosphor and phosphor compounds as disclosed herein can in some aspects comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric or ceramic matrix) arranged to cover or partially cover one or more solid state light emitters. One or more luminescent materials useable in devices as described herein may be down-converting or up-converting, or can include a combination of both types.

The use of wavelength conversion materials can provide additional properties and/or features to LED devices including, for example, improved long term reliability (e.g., improved properties beyond 1000 hours or more at 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to embodiments of LED structures having a light source that comprises LEDs. The LED packages can be arranged in different ways and are relatively small, while at the same time are efficient, reliable and cost effective. The embodiments according to the disclosure herein can have different shaped encapsulants, and can emit light with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein is described with reference to example embodiments, but it is understood that the disclosure herein can be embodied in many different forms and should not be construed as limited to the embodiments set forth herein. In particular, the disclosure herein is described below in regards to certain LED apparatuses having LEDs in different configurations, but it is understood that the disclosure herein can be used for many other LED packages with other LED configurations. LED packages using the disclosure herein can also have many different shapes beyond those described below, such as rectangular, and the solder pads and attach pads can be arranged in many different ways. In other embodiments, the emission intensity of the different types of LEDs can be controlled to vary the overall LED package emission. The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A gap between the LEDs and on the common substrate can extend to certain layers or can extend all the way to or from the common substrate. Therefore, a monolithic LED can comprise more than one LED junctions on a common substrate, and the gaps between the LEDs can be formed to at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In some embodiments LEDs can be phosphor-converted red or green. In multiple LED packages, the LEDs can be serially interconnected or can be interconnected in different serial and parallel combinations.

Coatings, encapsulants, encapsulant layers, and the like are disclosed herein and can comprise any material that provides mechanical, chemical, and/or environmental protection to a substrate, reflective layer, or other LED component. A coating, encapsulant and/or encapsulant layer can be configured in some embodiments as a layer that covers a substantially horizontal or vertical surface, and in some aspects can comprise a layer disposed on top of another layer, surface or structure whether or not it fully surrounds all sides of the other layer, surface or structure. In some embodiments a coating, encapsulant and/or encapsulant layer can comprise or consist of a dielectric as disclosed herein. It is also understood that when a feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Coating materials disclosed herein can in some aspects comprise a number of encapsulating layers, coatings and/or dielectric materials and compounds, including for example silicon oxide, silicon nitride, aluminum oxide, titanium dioxide, non-metallic oxides, non-metallic nitrides, tantalum oxide, aluminum, nickel, titanium, tungsten, platinum, combinations thereof or alloys thereof, etc. In some aspects such encapsulants, coatings and/or dielectrics can comprise one or more materials arranged to provide desired electrical isolation and high thermal conductivity. For example, a dielectric can provide a desired electrical isolation between electrical traces and/or sets of solid state emitters. In some aspects, such substrates can comprise ceramic such as alumina (Al2O3), aluminum nitride (AlN), silicon carbide (SiC), silicon, or a plastic or polymeric material such as polyimide, polyester, metal, etc.

In some cases it is desirable to increase the speed of manufacturing LED devices. One approach to increasing speed of manufacture is to assemble many components on a single substrate (or "superstate" as described below) and later separate the groups into component arrays. This can be particularly useful when creating multi-color component arrays for use in high-density (HD) video displays. Multiple arrays can be created as a large sheet and subsequently singulated into individual arrays comprising a plurality of LED devices for each singulated portion.

Additionally, the elimination of parts can streamline the manufacturing process and improve light quality. For example, LED devices can be assembled without the use of, or devoid of, a substrate. This can be accomplished by assembling the LEDs topside down, such that the LED is assembled on a transparent "superstate" or top-side light transmissive layer, which will become an outer surface in the finished product. The components can then be electrically connected through exposed electrical connection points on the opposite side of the LEDs. The device or apparatus therefore does not have (or is devoid of) a traditional "substrate" on the side of the LEDs opposite the light-transmitting side, such as, for example, a ceramic, metal, or other type of material substrate upon which LEDS are often attached. An LED device built from the "topside down" as described herein can be considered a complete LED device, which is devoid of such a substrate. That is not to say that said LED device cannot later be assembled into a larger (e.g., multiple component) device, which can, for example, include a substrate.

Referring to FIG. 1, an example embodiment of an LED device is shown. A light emitting diode (LED) device, generally designated 100, is depicted in a typical assembly orientation (i.e., with the emitting surface in an upward direction). However, the construction of LED device 100 can occur from the top surface downward. LED device 100 begins with a superstrate, light-transmissive layer 110, which has an outer surface 112 and a component-side surface 114. Light-transmissive layer 110 can be made from any suitable light-transmissive material, for example such as glass, sapphire, epoxy, silicone. Light-transmissive layer 110 can optionally have features for altering the light emission characteristics of LED device 100, which are described in more detail below. Adjacent to and under light-transmissive layer 110 is a die-attach layer 120. Die-attach layer can be the same material as light-transmissive layer 110 when suitable, or it can be a different, compatible material. For example, in some embodiments both light-transmissive layer 110 and die-attach layer 120 can be an epoxy or silicone material, with light-transmissive layer 110 being provided in a substantially fully cured state at assembly, while die-attach layer 120 is provided in an uncured, viscous, and/or adhesive state and subsequently cured. Die-attach layer 120 can be applied on an entire surface of light-transmissive layer 110 (as shown in FIG. 1), or die-attach layer 120 can be applied to selected areas of light-transmissive layer 110.

LED components 130 are then placed onto die-attach layer 120 such that a light-emitting surface 132 is in contact with die-attach layer 120. LED components 130 can be grouped as an array and can include multiple colors, such as red, green, and blue (RGB) LEDs. In some such embodiments, the LED components 130 are grouped into red-green-blue arrays for use in video displays. Placing LED components 130 directly onto adhesive die-attach layer 120 rather than on a traditional substrate advantageously allows the transfer of large numbers of LEDs at once. This can greatly improve processing speed, which is particularly useful when assembling mini- or micro-LEDs. Although it is not standardized, mini-LEDs are generally described as approximately 90-250 micrometers (μm) in size, while micro-LEDs are usually considered to be 10-90 μm in size. This method can also simplify placement of multi-colored LEDs. For example, all LEDs of a first color can be placed in a single group, followed by mass placement of a second and third color.

In some embodiments, die-attach layer 120 can be interspersed or layered with additional optics layers (not shown). For example, an optics layer can comprise light-diffusing or wavelength-converting materials. An optics layer can be applied, for example, in a selected area between the superstrate (e.g., light-transmissive layer 110) and top surface of LED component 130. In other embodiments, the superstrate itself can be modified to incorporate light-diffusing or wavelength-conversion (e.g., phosphor) materials and/or color-filtering materials in selected areas.

It is additionally noted that LED components 130 can refer to any LED chips commonly used in the art, including the LED semiconductor active layers making up the diode itself with ohmic contacts which are typically metallized and presented on a surface for the purpose of electrical and/or mechanical attachment; passivation layers required for protection of the semiconductor and other underlying layers; and optionally a substrate of its own, such as sapphire, silicon carbide, or silicon.

After LED components 130 are adhered to die-attach layer 120, an encapsulant layer 140 is applied around and between LED components 130. Encapsulant layer 140 can be applied by any coating or dispensing approach as described herein or otherwise known in the art, such as dispensing, molding, stenciling, screen printing, spinning, spraying, powder-coating, slit coating, etc. Encapsulant layer 140, can comprise one or more of epoxy, epoxy-polyester hybrid, aliphatic urethane, TGIC polyester, non-TGIC polyester, silicone, silicone-modified polyester, silicone hybrid, silicone-epoxy hybrid, acrylic, polycarbonate, or any suitable combinations thereof. Encapsulant layer 140 can be used to control the light output of LED device 100. For example, encapsulant layer 140 can be an electrically insulating and a non-reflective or opaque material, such as a white, grey, dark, or black material. For the purposes of the disclosure herein, a non-reflective or opaque material is defined as a material or surface that does not reflect or redirect the majority of light impinging upon it. Black encapsulants can be preferable, for example, in one-sided video displays. Alternately, encapsulant layer 140 can be a clear material, which can be used, for example, in two-sided video displays or transparent displays such as "heads-up" displays. Encapsulant layer 140 can be particularly useful for controlling light output in the far field. Encapsulant layer 140 can further include multiple layers comprising the same or different materials and/or colors. For example, encapsulant layer 140 can be formed of a first white layer followed by a black layer. LED components 130 are additionally provided with one or more electrically conductive elements 134, such as metal "bumps" or pads on a side of each LED component 130 away from die-attach layer 120. These conductive elements 134 can be applied in a variety of conventional methods, such as wire bump bonding, solder bumping, plating, or other metallization techniques. Conductive elements 134 are, in the embodiment shown, electrically connected by applying one or more layers of electrically-conductive (typically metal) traces 150 over the conductive elements 134. Also shown in FIG. 1 is solder mask 160 (optional), which is disposed at least partially over the one or more layers of traces 150. In some embodiments, the solder mask 160 may be applied to outermost traces of multiple layers of traces 150.

In some embodiments, it is advantageous to provide electrically conductive elements 134 on the surface of LED components 130 before encapsulant layer(s) 140 are applied. Then encapsulant layer 140 can be applied on all bottom surfaces, after which the whole surface can be planarized by any method, such as grinding, lapping, etc., forming surface S.

Figure 2A:
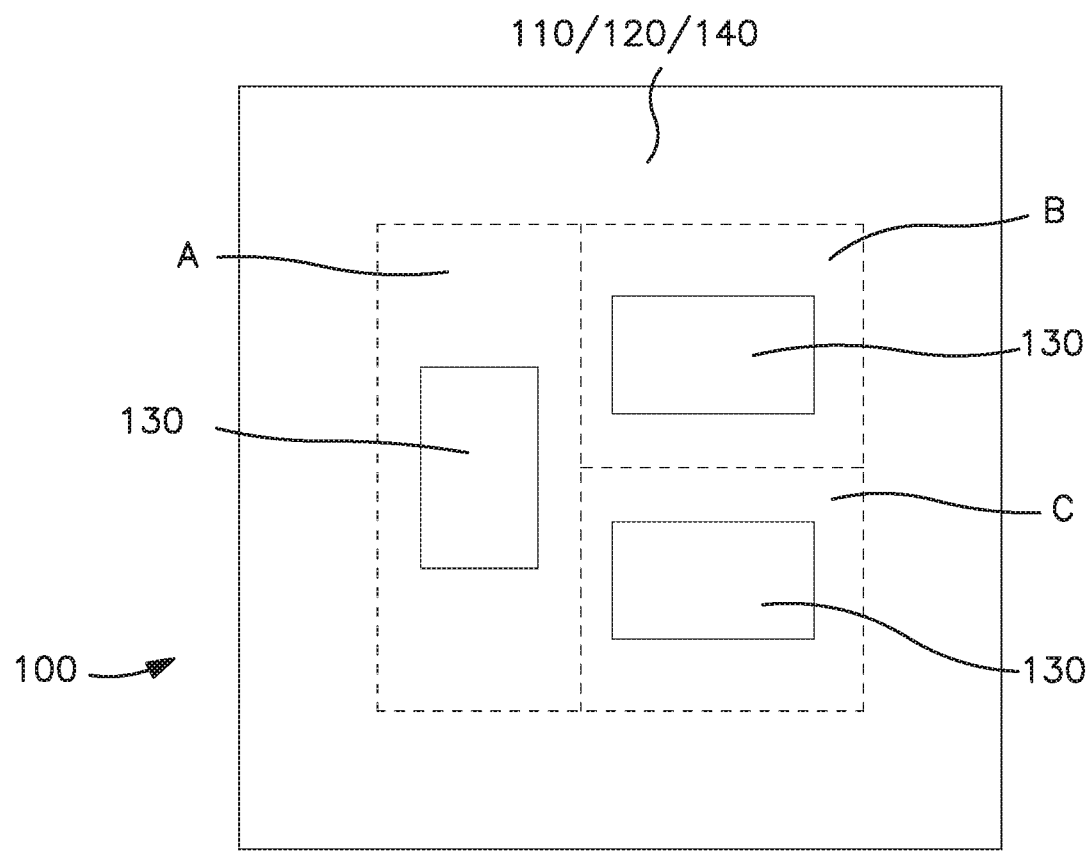
FIG. 2A is a top view of an LED apparatus according to the disclosure herein.

FIG. 2A depicts a schematic drawing of a top view of LED device 100 illustrating example regions for light transmittal. In some embodiments, light extraction features, also known as optical elements, (e.g., 110 and 116 described below) can be disposed only on specific, localized areas of LED device 100. For example, the areas located above LEDs 130 can be considered as optical element regions A, B, and C. These regions are also seen in profile in FIG. 1. In some embodiments, light-transmissive layer 110 can be disposed over only one LED 130 (i.e., region A, or region B, or region C). In other embodiments, optical elements can be disposed over any two regions A, B, and C. In yet other embodiments, optical elements can be disposed over all three regions but without extending over the entire surface of LED 100. The features of light-transmissive layer 110 can vary between regions, having different depths, shapes, etc. Multiple optical elements can further be combined, such as adding a surface texturization 116, described in further detail below.

Figure 2B:
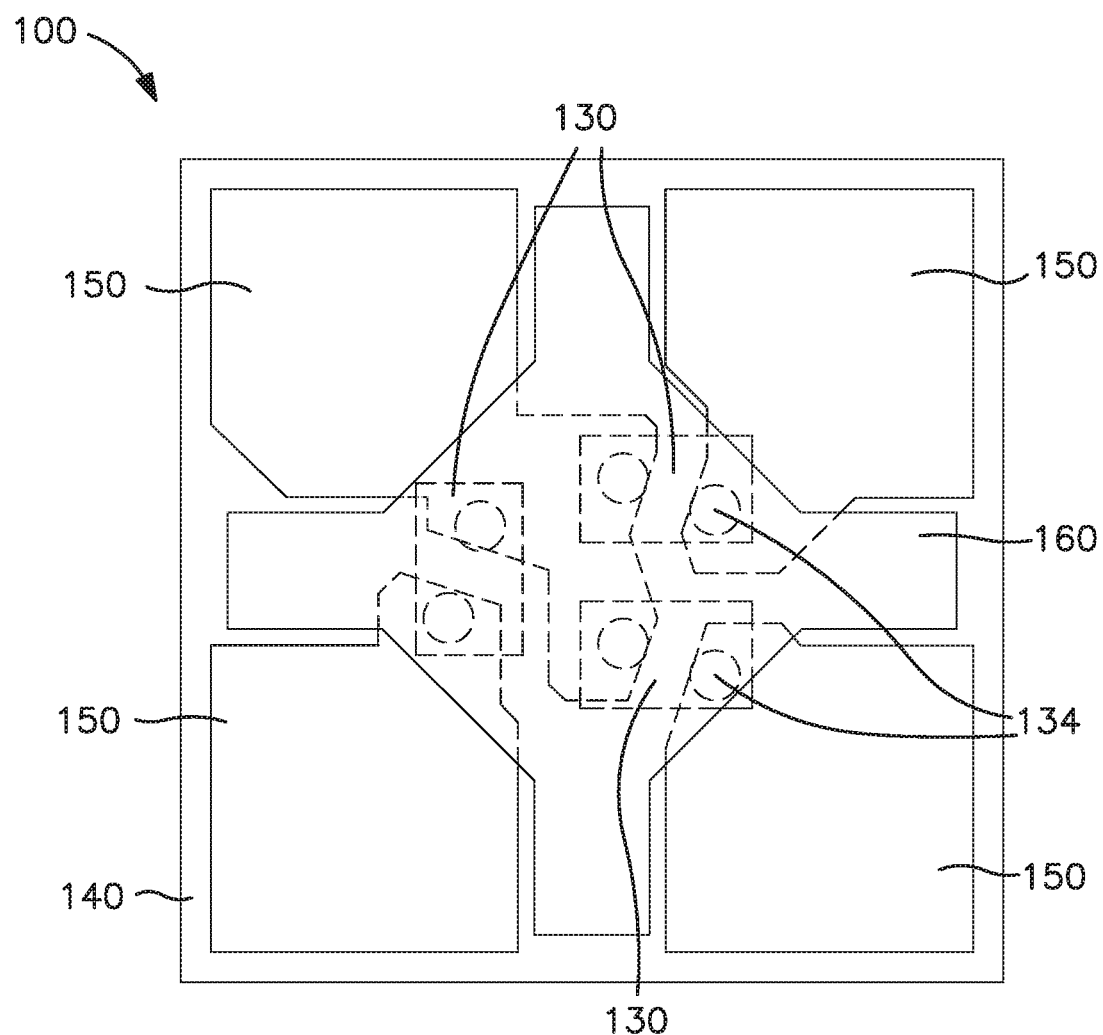
FIG. 2B is a bottom view of an LED apparatus according to the disclosure herein.

Referring to FIG. 2B, LED device 100 is viewed schematically from a bottom orientation (i.e., opposite the light emitting surface), showing more detail of traces 150 and solder mask 160. In the embodiment shown, traces 150 electrically connect to conductive elements 134 in an array of LED components 130 and extend beyond the boundaries of LED components 130 to provide attachment points for external circuitry. For example, traces 150 can be used to mount LED device 100 on a substrate or printed circuit board (PCB). In some embodiments, multiple layers of electrical traces can be constructed on the lower surface of LED device 100, to add more functionality or to avoid the need for a circuit board. This is described in more detail below.

Figure 3A:
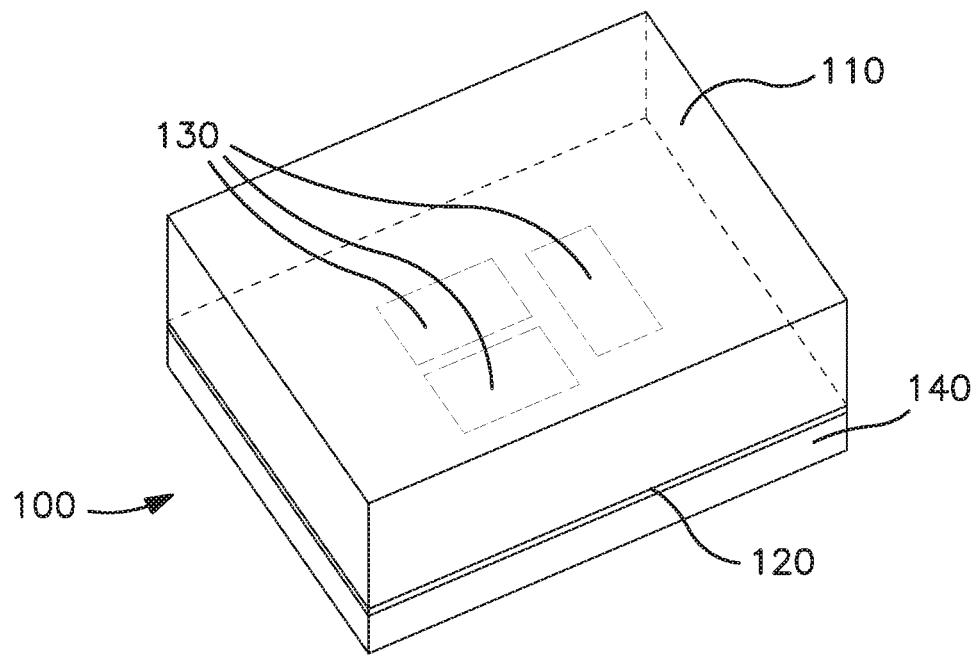
FIG. 3A is an isometric top view of an LED apparatus according to the disclosure herein.
Figure 3B:
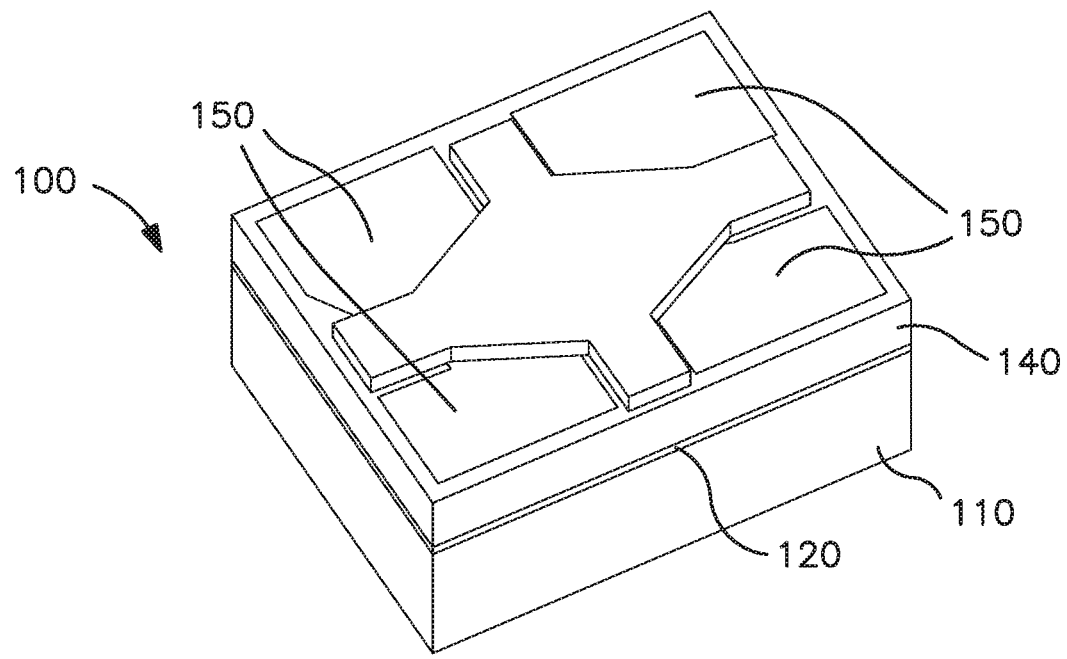
FIG. 3B is an isometric bottom view of an LED apparatus according to the disclosure herein.

FIGS. 3A-3B show isometric views of a finished LED device 100. FIG. 3A is a top view, where LED components 130 can be seen through light-transmissive layer 110 and die-attach layer 120. Encapsulant layer 140 extends around the lower portion of LED device 100. In this example embodiment, encapsulant layer 140 is a black encapsulant layer. FIG. 3B is a bottom view showing traces 150 and solder mask 160 disposed on a bottom surface of the LEDs opposite the die-attach layer 120. Solder mask 160 can be used, for example, to prevent shorting when soldering LED device 100 to a PCB.

Figure 4:
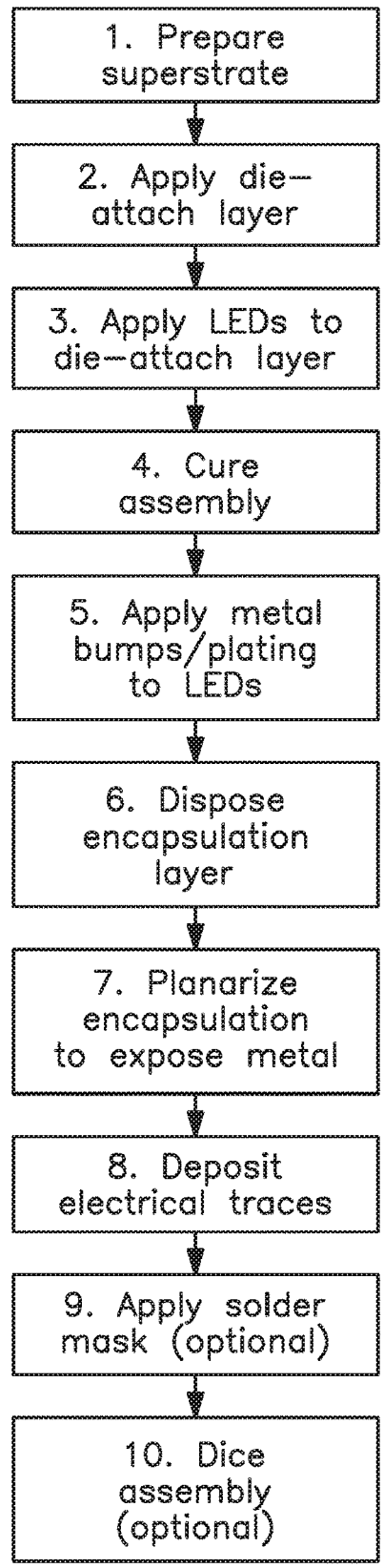
FIG. 4 is a flow chart of a method of producing an LED apparatus according to the disclosure herein.

A corresponding example method of producing an LED device (e.g., LED device 100) is illustrated in FIG. 4. First, a light-transmissive "superstate" (e.g., light-transmissive layer 110) is prepared (Step 1). The superstrate can be prepared with either a smooth or a textured outer surface, as described above. The light-transmissive layer can be clear, or there may be added diffusers or other wavelength-conversion materials (e.g., "optics layers" as previously described). Next (Step 2), a die-attach layer (e.g., die-attach layer 120) is applied to the superstrate. For example, the die-attach layer can be a light-transmitting epoxy or silicone die attach adhesive.

LEDs (e.g., LED components 130) are then pressed into the die-attach layer (Step 3) such that the light-emitting surface is in contact with the die-attach layer, and the die-attach layer is then cured (Step 4). The LEDs can be applied to the die-attach layer by a variety of known methods, including pick-and-place or direct tape transfer. The LEDs can be, for example, transferred en masse from a tape, where the tape is subsequently removed and the die-attach surface is cleaned and prepared for the next step. Once the die-attach layer is cured, the LEDs can have conductive elements (e.g., metal bumps) applied to the exposed electrical connections. Optionally, the LEDs can be plated using direct metallization (Step 5). Alternately, the LEDs can be pre-bumped before attaching to the die-attach layer or have thick metal layers applied at the wafer level.

At this point, the LEDs are fixed securely to the superstrate by their light-transmitting surface, and the volume of the LEDs is exposed. An encapsulant layer is then applied over the LEDs (Step 6). The encapsulant layer can be applied such that it entirely covers all of the exposed surfaces the LEDs, including the electrical connections and/or metal bumps. After curing, a thin layer of the encapsulant layer is then removed as necessary to reveal the metal connection points and planarize the surface (Step 7). Removal, or planarization, of the encapsulation can be accomplished by, for example, lapping, buffing, grinding, or sanding. Next, electrical traces (e.g., 150) are applied to the metal bumps by any suitable, conventional circuit laying methods (Step 8). After depositing the metal traces, a layer of solder mask can optionally be applied (Step 9) according to design requirements. This can be accomplished, for example, by a screen-print method or using a photo-imagable solder mask. The sheet of transmissive material can then be post-processed by separating (e.g., by dicing) the LED apparatus multiple portions, each of which comprises a plurality of LEDs which can be configured as individual LED arrays (Step 10). The diced components can then be further sorted and prepared for installation into larger LED devices.

Figure 5:
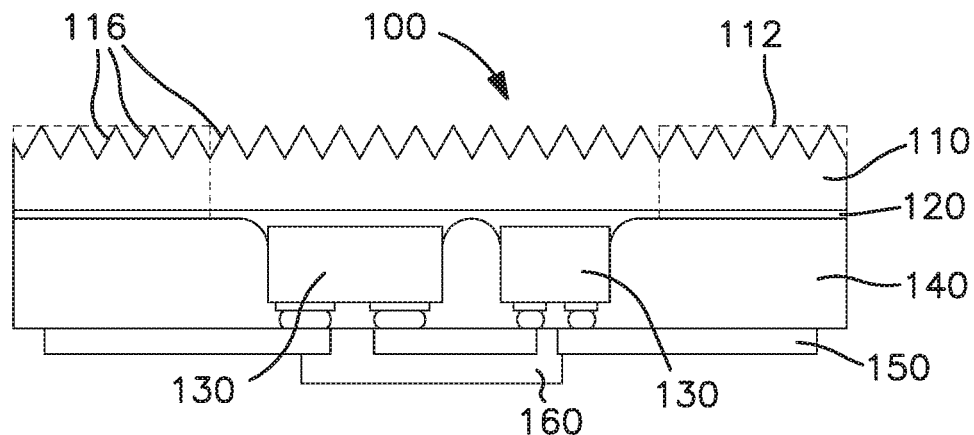
FIG. 5 is a cross-sectional side view of another LED apparatus according to the disclosure herein.

As previously mentioned, an LED device as disclosed herein can also have additional, optional features to affect the light output and particularly to improve far-field viewing. For example, the superstrate can be treated to create a surface texturization. FIG. 5 depicts LED device 100 with an example surface texturization 116 on outer surface 112 of light-transmissive layer 110. Texturization 116 can be either pre-formed on light-transmissive layer 110, or it can be formed during or after manufacture of the LED device 100. For example, texturization 116 can be imprinted into light-transmissive layer 110 as it is formed during the forming process of the light-transmissive layer 110, or it can be created at a later point in the process (e.g., see FIG. 4), using conventional methods such as cutting, molding, embossing, or etching. Material can be added, removed, or reformed. Texturization 116 can be the same material as light-transmissive layer 110, or it can be a different material. One method of producing texturization 116, for example, is to form light-transmissive layer 110 on a ceramic master. The ceramic material can have natural surface variations which produce a pattern of texturization 116. In this case the surface variations can be considered random or natural. Alternately, the variations can also be prescribed, such as, for example, in a regular, repeated, predetermined, or designed pattern. The pattern of texturization 116 can be adapted to achieve various effects, and it can be either a prescribed (which also can be referred to as regular) grid pattern, which acts as a lens, or a random pattern. The pattern is, in some aspects, a microstructure pattern having, for example, a size on the order of a microstructure, (e.g., 1-100 µm). In some embodiments having the microstructure pattern for surface texturization 116, the microstructure pattern is located on outer surface 112 of light-transmissive layer 110 in a prescribed (which also can be referred to as regular) or random pattern. Texturization 116 can be consistent over the entire outer surface of the superstrate, or it can be applied in a targeted region, as described with regards to FIG. 2A. For example, texturization 116 can have features aligned with an LED 130 (e.g., regions, A, B, and or C). Some LEDs 130 can have a different feature over or beside them than others. Different regions A, B, and C can have the same or different texturizations 116, which can vary in size, height, shape, location, etc. It is also envisioned that the microstructure can be non-patterned in whole or partially.

There are several advantages to producing an LED device (e.g., 100) without a, or devoid of a, substrate and with a surrounding encapsulant. With this method it is possible to rapidly produce either individual multi-color arrays of LEDs, or larger matrices of LEDs. Adhering the LEDs to an epoxy die-attach layer provides a robust mechanical design and is compatible with rapid processing methods such as mass transfer. Additionally, the devices can be thinner and have a lower cost than conventional LED devices that are produced on a substrate. This allows increased packaging density. The use of an encapsulant, particularly a dark or black encapsulant, can improve far-field light consistency and effective contrast under ambient light. Furthermore, the electrical connections to the LED die can be made en-mass with standard wafer or PCB board-level processing.

Figure 6:
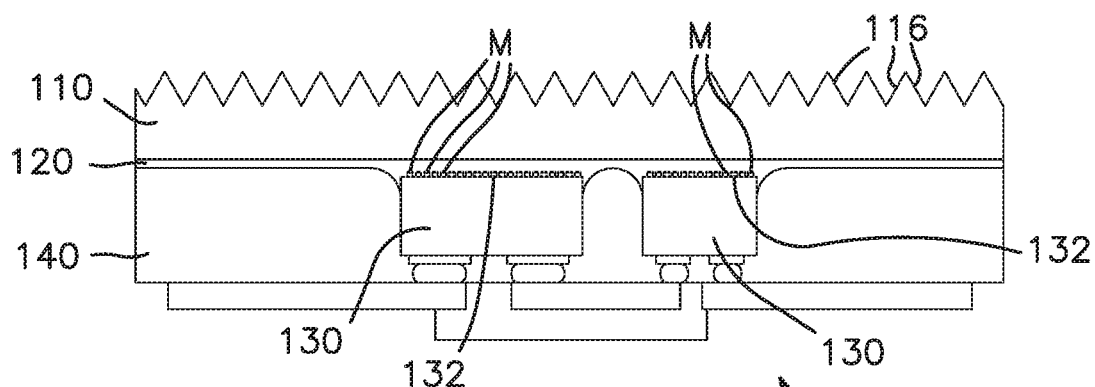
FIG. 6 is a cross-sectional side view of another LED apparatus according to the disclosure herein.

Referring to FIG. 6, the LED components 130 can also have features applied to the light-emitting surfaces 132 to alter light output. In some embodiments, in addition to, or in place of, a microstructure pattern or texturization, a pattern element may be provided on a surface of one or more LED components 130 adjacent to the die-attach layer 120. This can be accomplished at the LED wafer level by adding layers to the back side, or by creating a pattern with a removal process such as those commonly used on sapphire substrates prior to epi growth. This can be in the form of material M deposited on light-emitting surface 132. Material M is a patterned material and can include, for example, sapphire, metal, organic, or inorganic materials. Material M can be applied selectively to individual LED components 130 in an array, or to all LED components 130 in an array. Additionally, material M can be deposited in a pattern designed to achieve a particular effect, such as reshaping or scattering the light. This can also be useful in improving far field light quality.

Figure 7:
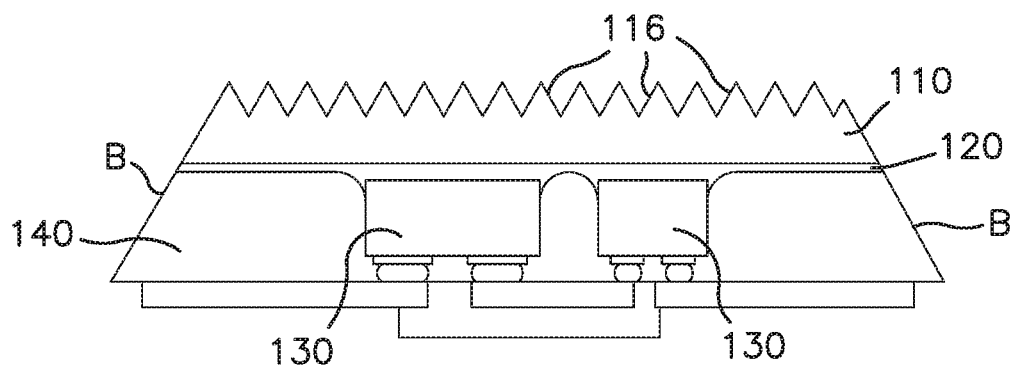
FIG. 7 is a cross-sectional side view of another LED apparatus according to the disclosure herein.

In another embodiment, LED device 100 can include shaped edges that can for example be curved edges or as shown in FIG. 7 beveled edges B. Beveled edges B can affect the light output pattern and can help make LED device 100 more robust against external forces, which may occur in an assembly. It is to be understood that the features of FIGS. 5-7 can be used individually or in any combination.

Figure 8:
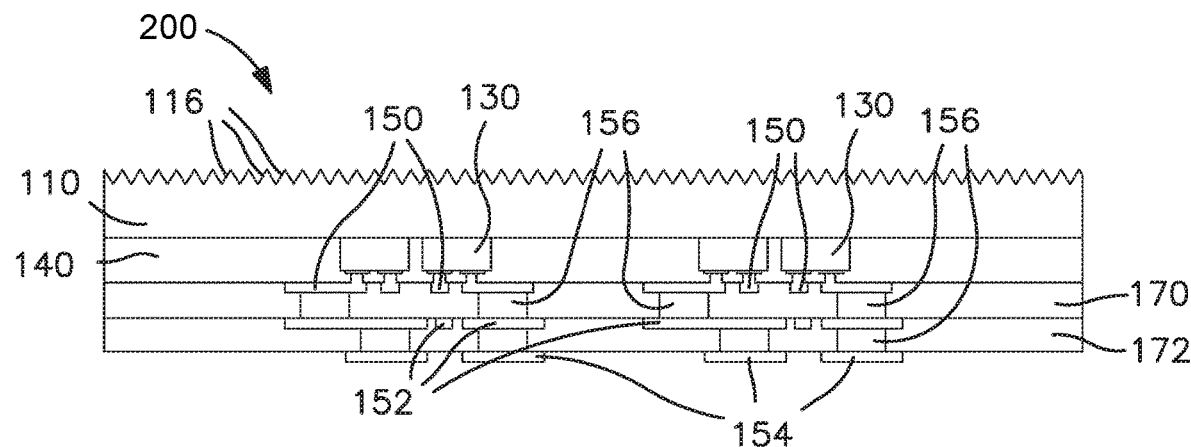
FIG. 8 is a cross-sectional side view of another LED apparatus according to the disclosure herein.

FIG. 8 depicts another embodiment of an LED device, generally designated 200. LED device 200 is constructed in the same manner as LED device 100, by disposing LED components 130 on a superstrate. (For simplicity, die-attach layer 120 is not shown.) After depositing electrically conductive traces 150, an insulating layer 170 is added. Further electrical traces, e.g., 152, 154 can then be successively added as needed according to the particular design requirements. Electrical traces 152, 154 are separated by an insulating layer 172 and are connected to one another and to traces 150 by conducting vias 156. LED device 200 can have any number of alternating electrical and insulating layers to meet the design requirements and can also include ground plane and power plane layers. This construction introduces the ability to form more complex circuitry than would otherwise be possible by allowing wires to cross one another in different layers (e.g., to allow for a three-dimensionally wired circuit). LED device 200 therefore comprises a multi-layer construction and can also advantageously be populated, in some embodiments, with other types of active or passive components (not shown) to provide enhanced functionality for LED device 200.

Figure 9:
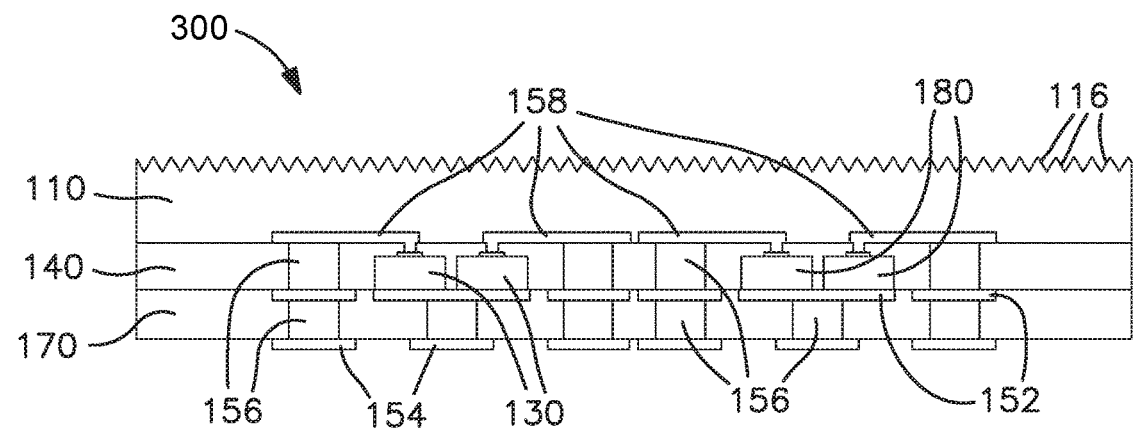
FIG. 9 is a cross-sectional side view of another LED apparatus according to the disclosure herein.

FIG. 9 depicts an alternate embodiment of a multi-layer LED device, generally designated 300. In this embodiment, which is also constructed from a top-down approach, electrical traces 158 are deposited on component-side surface 114 of light-transmissive layer 110 prior to attaching LED components 130. This accommodates the use of LEDs having a vertical die, i.e., having contacts on opposite sides of an LED. Electrically conductive metal traces 158 can be configured to maximize light output, for example, by minimizing the size or employing transparent material, such as indium tin oxide (ITO), for the traces. Additionally, electrical traces 158 can be a combination of transparent material and metal connection points. In other aspects, LED device 300 is similar to LED device 200. After depositing a first layer of electrically conductive metal traces 158, LED components 130 are electrically bonded to electrical traces 158, and encapsulant layer 140 is added. Next, alternating layers of electrical traces (e.g., 152, 154) and insulating layers 170 can then be successively added as needed according to the particular design requirements. To accomplish electrical connection, bumps or thick metal layers may be added to the bottom of LED components 130. For example a thick copper pad can be put an LED component 130 while it is in wafer form. Alternatively, a laser can be used to clear the pad before applying the electrical traces.

Electrical traces 152, 154 are separated by an insulating layer 172 and are connected to one another and to traces 150 by conducting vias 156. This construction introduces the ability to form more complex circuitry than would otherwise be possible by allowing wires to cross one another in different layers (e.g., to allow for a three-dimensionally wired circuit). LED device 300 therefore comprises a multilayer construction and can also advantageously be populated, in some embodiments, with other types of active or passive components (not shown) to provide enhanced functionality for LED device 300. Similarly to LED device 200, LED device 300 can have any number of alternating electrical and insulating layers to meet the design requirements and can also include ground plane and power plane layers. Additionally, it is to be understood that features of LED device 200 and LED device 300 can be combined. For example, some regions of an LED device can have an electrical trace 158 adjacent to the die attach layer 120 to allow LED components 130 to be bonded to the traces (i.e., oriented in a vertical direction), while other regions of the device have LEDs that are adhered to the die attach layer 120 in a horizontal orientation.

In some cases it is further desirable to decrease the cost of manufacturing LED devices, again such as in the case as video screens using multi-colored LED components in a red-green-blue (RGB) array. One approach to decreasing costs in an LED array is to replace higher-cost LED components with lower cost components. For example, red LEDs can cost more to manufacture than blue and/or green LEDs. However, it is necessary in such cases to have an LED that produces a red wavelength in order to produce the broad spectrum of colors needed for a high-quality video display.

In other embodiments as disclosed herein, the LED device replaces a red or other higher cost LED component with a lower-cost blue or green LED and provides a light-filtering layer or layers configured to change the spectrum of the light emitted from lower cost LED to have similar spectrum of the replaced part. The light-filtering layer(s) can comprise, for example, wavelength-conversion materials and/or color pigments.

Figure 10:
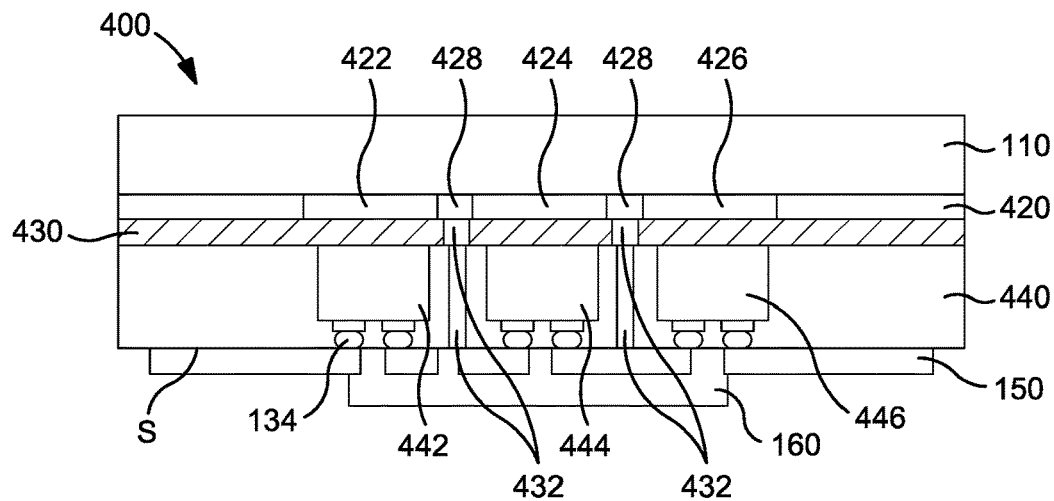
FIG. 10 is a cross-sectional side view of another LED apparatus according to the disclosure herein.

Referring to FIG. 10, an example embodiment of an LED device generally designated 400 is shown. Similarly to LED device 100, LED device 400 can be constructed from the top down beginning with light-transmissive layer 110. LED device 400 can have a second, color-filtering layer 420 applied to a first (i.e., LED attachment) side of light-transmissive layer 110. Color-filtering layer 420 can be formed of one or more colors and/or color-blocking regions according to design requirements. In a non-limiting example, FIG. 10 shows colored regions in color-filtering layer 420 that can, for example and without limitation, comprise a blue region 422, a green region 424, and a red region 426. Between and around colored regions 422, 424, and 426, an opaque material 428 (e.g., a white, dark, or black material) can be applied to assist in preventing color bleed between the LEDs and in some cases reduce the overall reflection of the component for improved contrast. Color-filtering layer 420 can be deposited in any appropriate method known in the art, such as by photo-resist, silkscreening etc., and can include multiple passes, layering, steps, etc. to achieve a multi-colored surface.

After color-filtering layer 420 has been deposited, an additional wavelength-conversion material 430 can be applied. Wavelength-conversion material 430 can be applied over an entire surface of color-filtering layer 420 as shown in FIG. 10, or it can be applied in prescribed regions. Wavelength-conversion material 430 can be, for example, phosphors or phosphor-containing compounds as described hereinabove. It is to be understood that wavelength-conversion layer 430 or color-filtering layer 420 can also optionally be omitted, using either one or the other alone. In some aspects, a light emitting diode (LED) apparatus can comprise one or more LED, one or more encapsulating layer, and a color-filtering layer. The color-filtering layer can be approximately 50 μm or less in thickness, and the color-filtering layer can be disposed on or at least partially within the one or more encapsulating layer.

From this point the construction of LED 400 can in some aspects be similar to that of the previous embodiments. A die-attach layer can be applied to the exposed surface of wavelength-conversion layer 430 (not shown for simplicity), and LEDs 442, 444, and 446 can be attached. LEDs 442, 444, and 446 can be aligned with color regions 422, 424, and 426, and they can be any color LED. The LEDs can be, for example, a same color as the color region with which they are aligned, or they can be a color which works in conjunction with the corresponding wavelength-conversion and/or color filter layer to transmit a desired color. LEDs 442, 444, and 446 are then "bumped" with conductive elements 134 and surrounded with an encapsulation layer 440. Encapsulation layer 440 can be similar to encapsulation layer 140 and formed of an opaque or clear material. If, for example, encapsulation layer 440 is formed of a clear material, LED device 500 can also optionally include light-blocking walls 432 disposed between LEDs 442, 444, and/or 446. In some aspects, encapsulation layer 440 can include a red-passing pigment that can brighten the red output by allowing a red spectrum to pass between the LEDs. As with LED device 100, encapsulation layer 440 is then processed to produce a planarized surface S that can accept traces 150 and, optionally, solder mask 160.

Figure 11A:
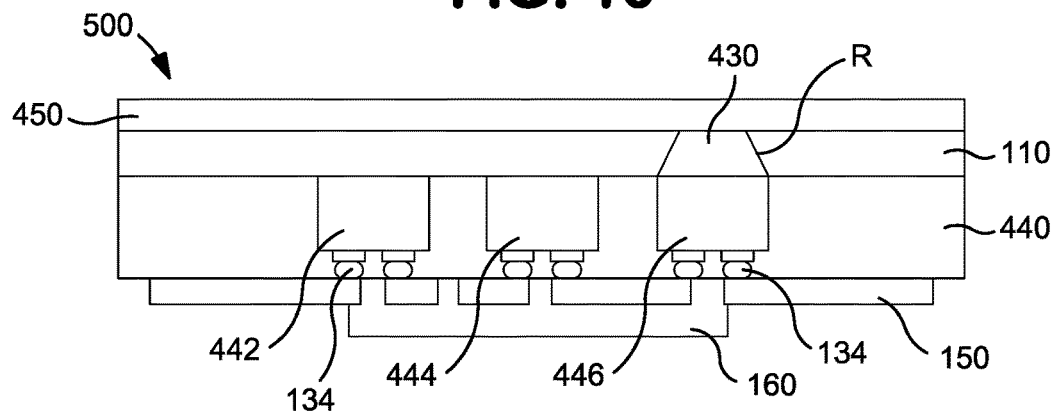
FIG. 11A is a cross-sectional side view of another LED apparatus according to the disclosure herein.
Figure 11B:
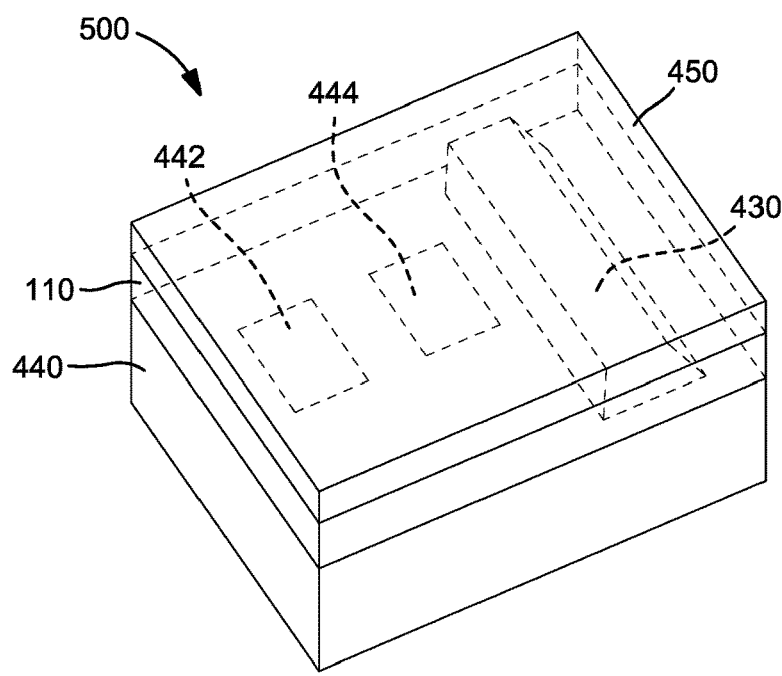
FIG. 11B is an isometric top view of the LED apparatus of FIG. 11A.

FIGS. 11A-11B depict another embodiment of an LED device, generally designated 500. FIG. 11A is a cross-sectional side view of LED device 500, and FIG. 11B is an isometric view of LED device 500. LED device 500 also comprises wavelength-conversion and/or color-filtering features, but in this case the features are achieved by incorporating a light-converting element into light-transmissive layer 110. In a non-limiting example, LED device 500 is again built up from light-transmissive layer 110. In this case, rather than depositing a color-filtering layer on an exposed surface of light-transmissive layer 110, a wavelength-conversion material is disposed in light-transmissive layer 110. For example, one or more recesses R are formed in light-transmissive layer 110. Recess R can pass partially or completely through the thickness of light-transmissive layer 110, and wavelength-conversion material is deposited in the recess or recesses. LEDs (e.g., 442, 444, and 446) are then attached to light-transmissive layer in a similar manner as described above, and at least one LED is aligned with the location of recess R and wavelength-conversion material 430. In the case where recess R passes completely through light-transmissive layer 110, a protective layer 450 can be applied to the outer surface of light-transmissive layer 110. Protective layer 450 can provide additional optical effects, such as diffusion materials, surface texturization, etc.

Figure 12A:
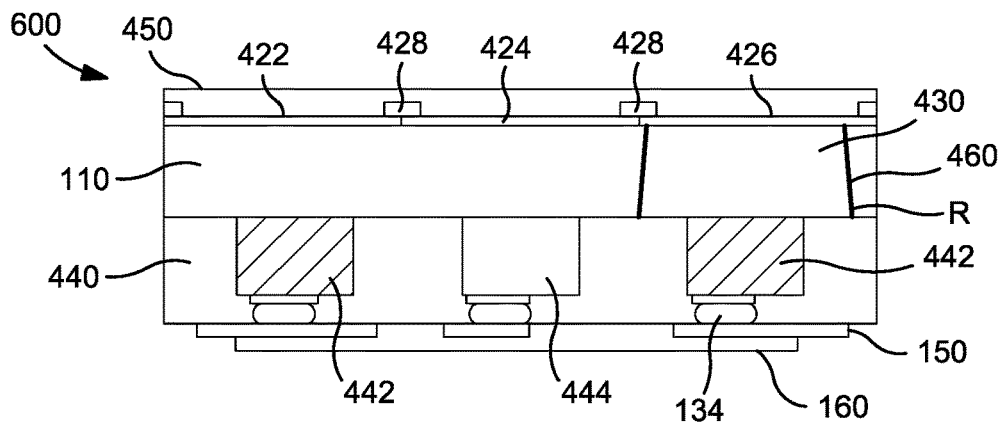
FIGS. 12A-12B are a cross-sectional side view of another LED apparatus according to the disclosure herein.
Figure 12B:
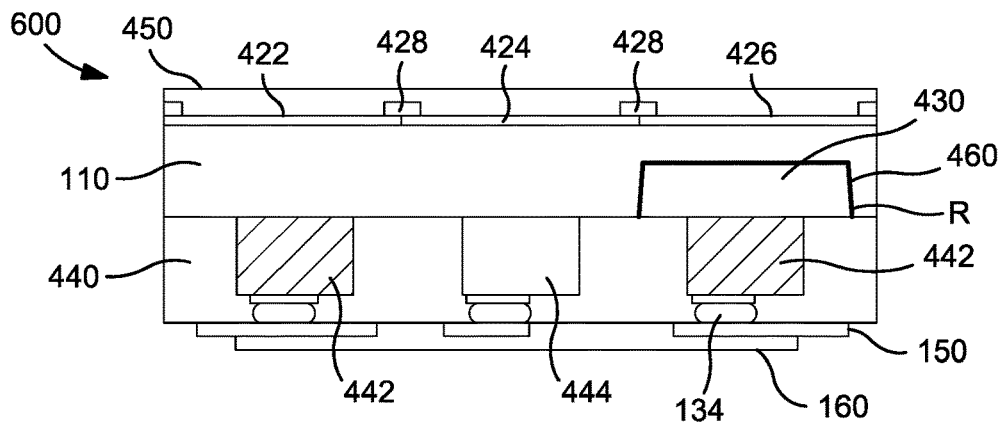
Figure 12C:
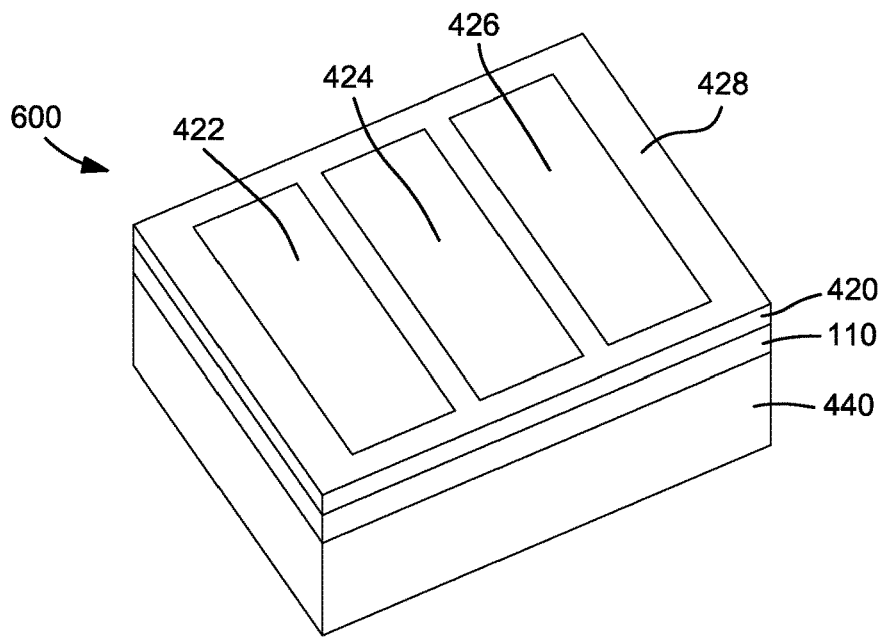
FIG. 12C is an isometric top view of the LED apparatus of FIG. 12A.

FIGS. 12A-12C illustrate another example embodiment of an LED device, generally designated 600. FIGS. 12A and 12B are alternate embodiments of LED device 600 shown in cross-sectional side view. Light-transmissive layer 110 is formed with a recess R. Recess R can be formed completely through the thickness of light-transmissive layer 110 (as shown in FIG. 12A), or recess R can pass partially through the thickness of light-transmissive layer 110 (as shown in FIG. 12B). After recess R is formed, the lower surface of light-transmissive layer 110 is covered with a coating 460. Coating 460 can be formed, for example, from an opaque material or pigmented material, and it can help prevent transmitted light "cross-talk" between LEDs 130 on a device. For example, coating 460 can be a red-passing pigment that is light-absorbing for blue and green colors. In the case of LED device 600, coating 460 can be a thin coating, which can be, for example, sprayed on using a technique described hereinabove or any other suitable technique. Coating 460 covers all of the surfaces of recess R. After the application of coating 460, recess R can then be filled with wavelength-conversion material 430.

One or more individual LEDs are attached to light-transmissive layer 110. In the example embodiment of LED device 600, the LEDs include two blue LEDs 442 and a green LED 444, which have conductive elements 134 deposited on the side of LEDs 442 and 444 away from light-transmissive layer 110.

Encapsulation layer 440 is applied to the first (lower) side of the LED device 600. Traces 150 are applied to encapsulation layer 440, and solder mask 160 is applied to traces 150. On the opposite (i.e., outer, or top) side of LED device 600, additional processing is also performed. Color-filtering materials 422, 424, and 426 are disposed on light-transmissive layer 110, and an opaque material 428 is disposed in selected areas to affect the light output. Opaque material 428 can be applied, for example, as a mask. It can be used to improve contrast of transmitted light when viewed in ambient light. In the non-limiting example of LED device 600, color filtering materials 422, 424, and 426 are applied in regions corresponding to the light-transmitting upper surface of each LED 442 and 444. However, it is also possible to provide color-filtering materials over only one or some of the LEDs in an array. As seen in FIGS. 12A-12B, an optional protective layer 450 is applied over the color filtering materials 422, 424, and 426 and opaque material 428. Protective layer 450 can be used to achieve additional optical effects, such as providing a matte finish. FIG. 12C, which is an isometric view of FIG. 12A or 12B, depicts LED device 600 without optional protective layer 450.

Figure 13:
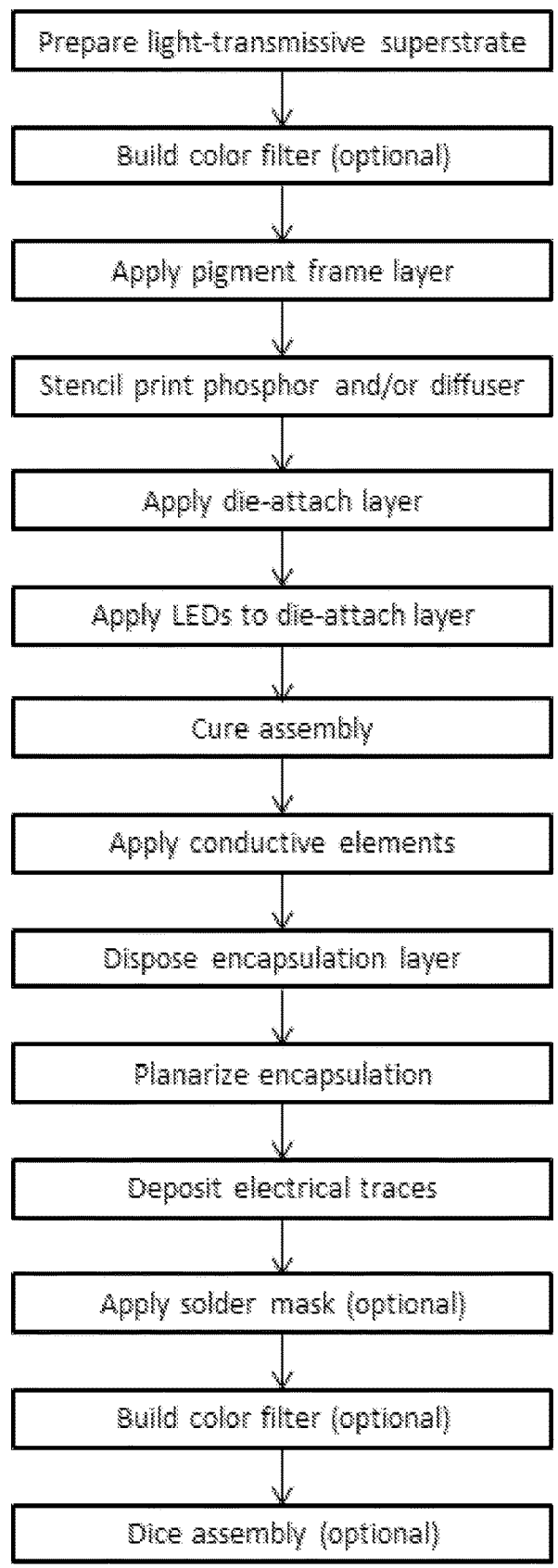
FIG. 13 is a flow chart of a method of producing an LED apparatus according to the disclosure herein.

FIG. 13 is a flow chart of an example process for forming an LED device similar to LED device 600. In a first step, a light-transmissive layer (e.g., 110) is prepared. Preparation can include, optionally applying a color filter layer to a first side of the light-transmissive layer, and/or forming one or more recesses in the first side. The recess can be formed either completely or only partially through the thickness of the light-transmissive layer. The recess can be formed, for example, by molding, embossing, or cutting a first side of the light-transmissive layer. After the recesses are formed, the same (first) side of light-transmissive layer can optionally be covered with an intermediate coating (e.g., 460). The coating can be used to achieve different effects on the emitted light. For example, by using a black material, the intermediate coating can be used to block light between different regions of the LED device. In some embodiments, the intermediate coating can be a pigmented color-filtering material such as a red-colored material. The intermediate material can be, for example, sprayed on using a technique described hereinabove or another suitable technique. The intermediate coating can cover substantially the entire first side of the light-transmissive layer including all of the surfaces of the recesses, or it can be applied selectively over portions of the light-transmissive layer.

After the optional application of the intermediate coating, the one or more recess is filled with wavelength-conversion material (e.g., 430). This can be accomplished by stencil printing or other suitable technique.

One or more individual LEDs are then attached to the light-transmissive layer, for example with a die-attach method described hereinabove. The LEDs can include, for example, two blue LEDs and a green LED, or possibly three blue LEDs. These LEDs can then have electrically conductive elements (e.g., 134) applied to the side of the LEDs away from the light-transmissive layer.

Next, the LEDs are encapsulated (e.g., 440). The encapsulation can completely cover the LEDs including the electrically conductive elements and the entire first side of the light-transmissive layer. The exposed outer surface of the encapsulation is then processed to produce a planarized surface, and electrical traces are applied to the planarized surface. A solder mask can be optionally applied to the electrical traces.

Further processing can then be performed on the second or "outer" side of the light-transmissive layer to expose the wavelength-conversion material to the outer side. After this step, color-filtering materials can be optionally applied to selected areas of the outer planarized surface, typically in place of the optional color application at an earlier step. Application of color-filtering materials can be performed, for example, by a photoresist method, and it can occur across several steps to accommodate several colors and/or methods. The color-filtering materials can optionally include a non-reflective mask between selected regions. The mask can be used for various effects, such as preventing color bleed between the LEDs or directing light in a certain direction. The color-filtering layer can be applied over all, or only a portion, of the second side of the light-transmissive layer, and it is also possible to provide color-filtering materials over only one, or some, or all of the LEDs in an array.

In an optional, further step, a protective layer (e.g., 450) is applied over the color filtering materials. The protective layer can be used to achieve additional optical effects, such as providing a matte finish.

Figure 14:
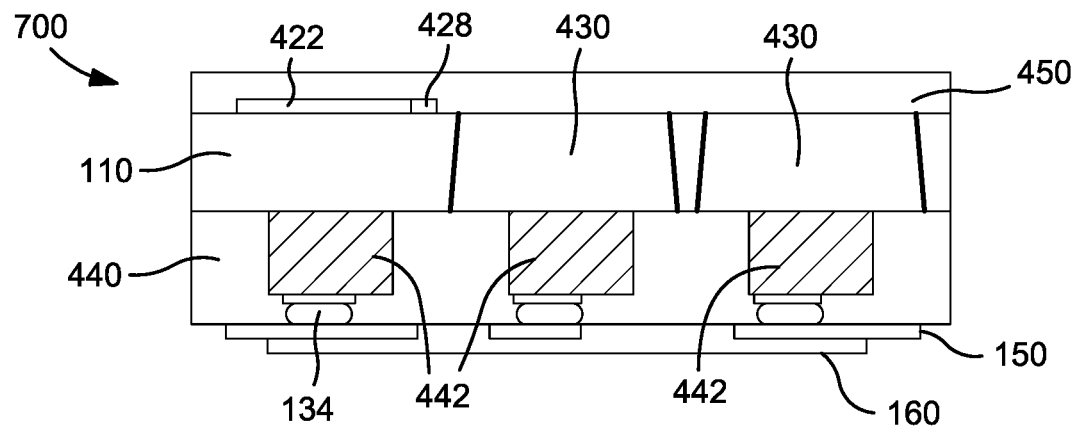
FIG. 14 is a cross-sectional side view of another LED apparatus according to the disclosure herein.
Figure 15:
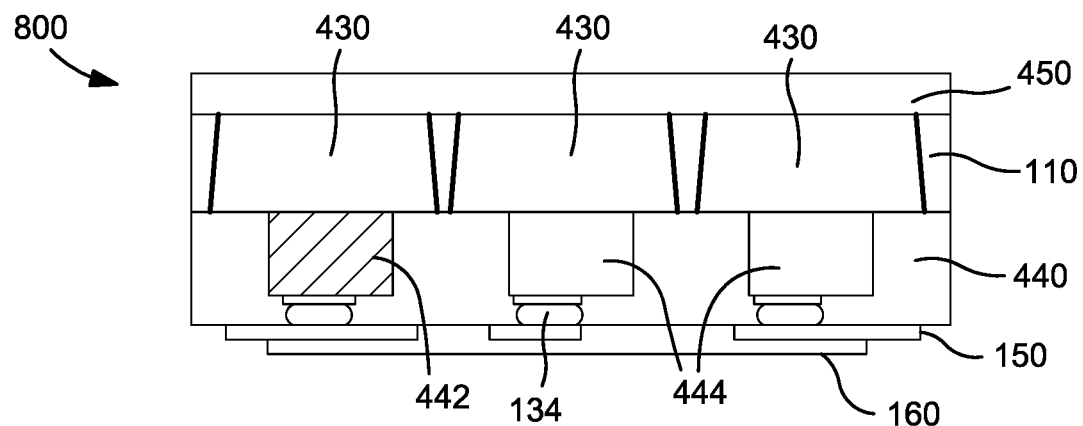
FIG. 15 is a cross-sectional side view of another LED apparatus according to the disclosure herein.

The forgoing process can be used for creating LED devices with a wide variety of light-converting features. For example, FIGS. 14 and 15 illustrate further possible embodiments of LED devices, generally designated 700 and 800, respectively. LED device 700 depicted in FIG. 14 can form an LED array using or consisting only of blue LEDs 442. LED device 700 has two regions of wavelength-conversion material 430, which are used to change the color of blue LED 442 to, for example, a green and red color. A blue color-filtering material 422 disposed over a blue LED 442 without a wavelength-conversion material 430 can be used to improve contrast. This can provide benefits such as reduced reflection, less SDE, and improved contrast. Opaque material 428 is disposed between color-filtering material 422 and an adjacent LED to further control the light output. A protective layer 450 is disposed on an outer surface of light-transmissive layer 110. In other respects LED device 700 is similar to other embodiments, with encapsulation layer 440, traces 150, and solder mask 160. FIG. 15 depicts LED device 800 with one blue LED 442 and two green LEDs 444. In this case each of the LEDs 442, 444 are disposed such that the emitted light passes through a wavelength-conversion material 430. The wavelength-conversion material can be the same or different between the different LEDs.

Figure 16:
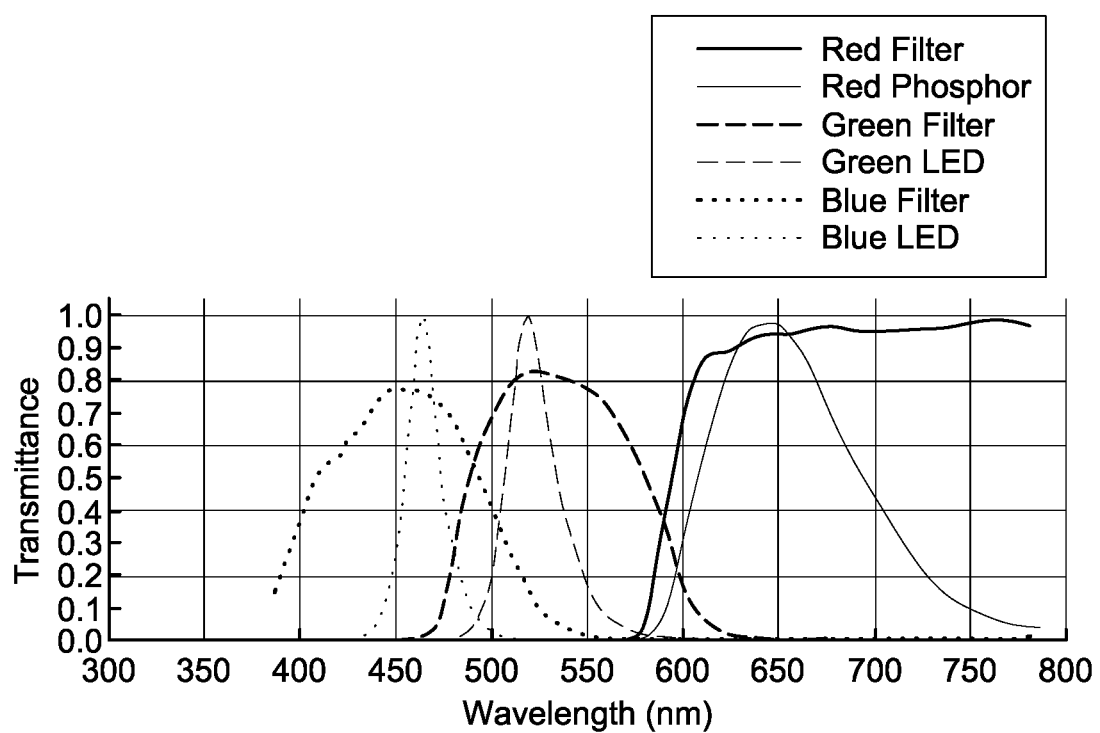
FIG. 16 is a graph comparing emission spectrums.

FIG. 16 is a graph comparing example spectra of LEDs, red phosphor, and RGB color filters. Although the blue and green filters do not significantly affect the output of the respective blue and greed LED chips, the filters can improve contrast by absorbing other colors from ambient light. As shown, the red filter does not significantly affect the red phosphor output. However, in some embodiments a shorter-emitting red phosphor would be affected by absorbing the shorter wavelengths. Alternatively, a longer (i.e., more red) filter can be used. As with the blue and green, the red filter can also improve contrast. In some aspects, a multi-color light emitting diode (LED) apparatus is provided where red light is achieved by phosphor converting light from a shorter wavelength color, such as for example, a blue or green spectrum or wavelength color.

Figure 17A:
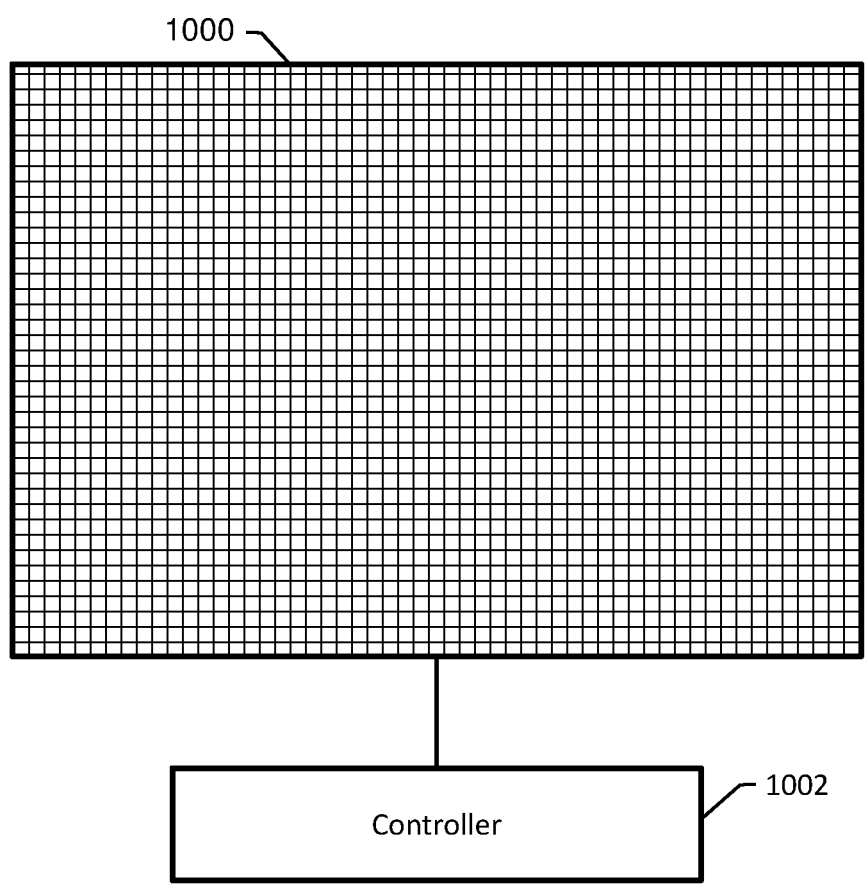
FIG. 17A is a diagram illustrating an example panel of LEDs.

FIG. 17A is a diagram illustrating an example panel 1000 of LED devices. Panel 1000 can be constructed using arrays of LED devices such as those disclosed herein (e.g., 100, 300, 400, 500, etc.). A controller 1002 is configured to provide power to panel 1000 and to control individual LEDs to display, e.g., pictures and video on panel 1000. For example, by using LED device 400 in panel 1000, panel 1000 can be made suitable for applications such as signs and indoor/outdoor panels. Opaque encapsulant 440 of LED device 400 allows for high contrast within panel 1000 and can reflect a relatively low amount of light. The overall pitch of panel 1000 can therefore be decreased. Panel 1000 can also have an improved viewing angle. In some aspects, a light emitting diode (LED) display device can comprise a plurality of LED apparatuses such as those disclosed herein or any others, wherein the LED apparatuses are supported by a primary mounting structure and arranged in a matrix of at least 32×32 or more, and wherein the primary mounting structure is devoid of other electronic semiconductor devices. The primary mounting structure can be any suitable structure, such as for example PCB that the LED components are affixed (soldered for example) to. It could then be connected to other PCBs that would have such components. In some aspects, the PCB should not have semiconductor or significant heat-generating components on the opposite side of the PCB that supports the LED array, which is advantageous as, for example, localized heat generation affects some LEDs differently than others causing color and intensity variations, manufacturing costs are simplified and/or reduced, and the structure is easier to rework.

Figure 17B:
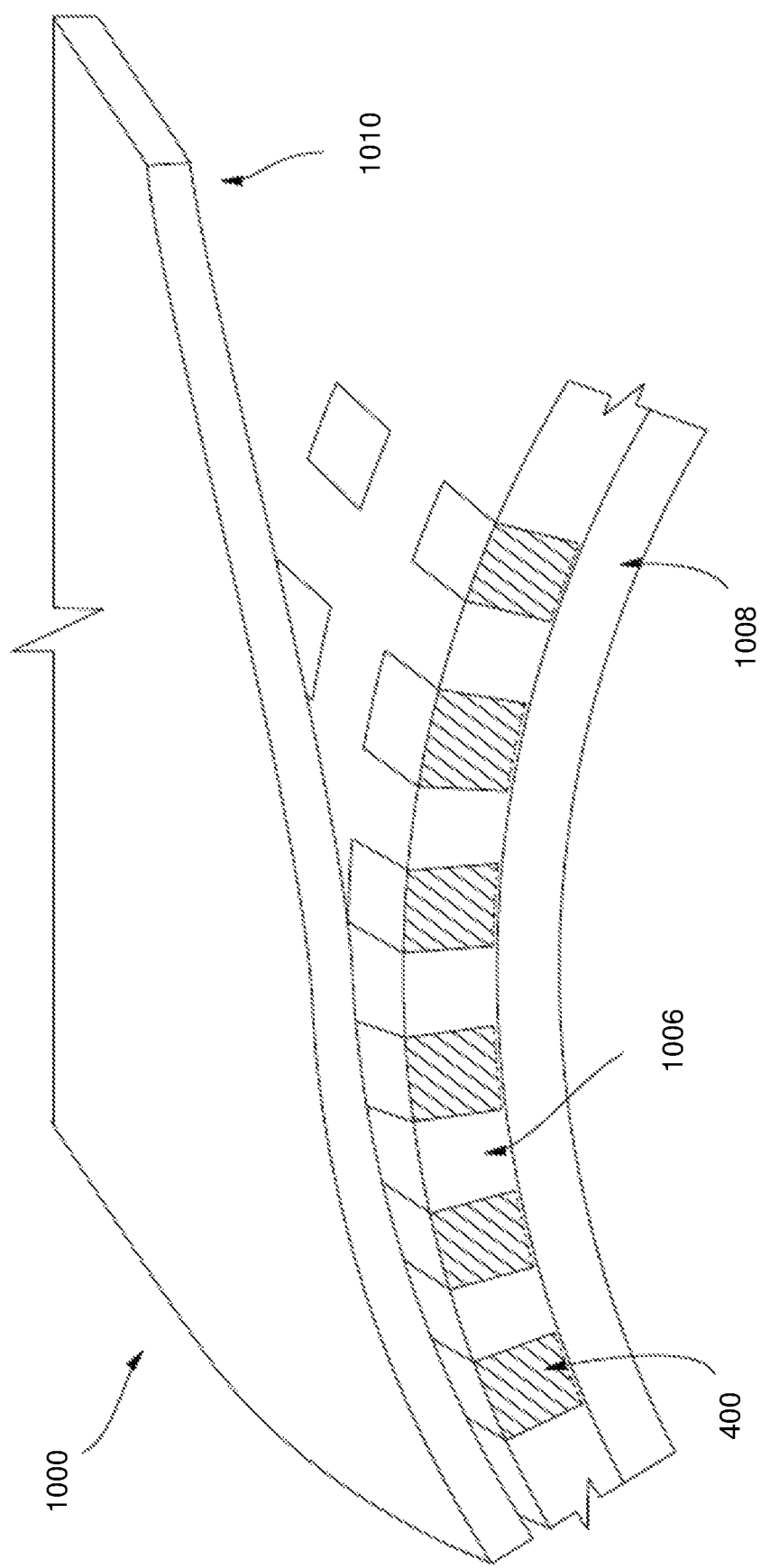
FIG. 17B is a cross-sectional side view of a portion of a panel of LEDs.

FIG. 17B is a cross-section side view of a portion of panel 1000. Panel 1000 includes areas 1006 between LED devices 400, which can be filled, for example, at a sub-panel assembly stage or during full panel assembly. LED devices 400 can be mounted on a layer 1008 that can be, for example, a motherboard or a sub-panel, which can be flat, or curved convex, concave, cylindrical, spherical, or other shapes. Panel 1000 can include one or more sheets 1010 of material added for, e.g., protection, anti glare, contrast, consistent look, filtering, light direction, 3D, parallax barrier, lenticular arrays, and so on. For example, sheets 1010 can include a protective layer. The protective layer can have a matte finish for reducing specular reflection. The protective layer can also include additional elements such as, for example, optics layers, diffractive elements, liquid crystal elements, and/or polarizing elements. Because LED devices (e.g., 200, 400, 600, etc.) can be formed with integrated electrical connection components and/or active elements, panel 1000 can further be devoid of additional electronic semiconductor devices other than what is contained within the LED component subassembly.

Although the embodiments described herein are directed toward arrays of LEDs, it is to be understood that the methods and devices can also be applied to single LEDs and single-color or multi-color arrays. It should also be apparent that other LED devices can be constructed using permutations and combinations of the color-filtering, masking, coating, and wavelength-conversion materials described herein.

While the subject matter has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitting diode (LED) apparatus comprising:
   a light-transmissive layer having a first side and a second side, the light-transmissive layer having one or more recesses formed in the first side;
   one or more regions of a wavelength-conversion material disposed in at least a portion of the first side of the light-transmissive layer;
   one or more LEDs disposed on the light-transmissive layer such that light emitted from the one or more LEDs can pass through the wavelength-conversion material; and
   an opaque encapsulant disposed around and between the one or more LEDs;

wherein at least a portion of a first recess of the one or more recesses is formed directly over a first LED of the one or more LEDs; and wherein at least a first region of the wavelength-conversion material is disposed within the first recess, such that the first region of the wavelength-conversion material is in direct contact with one of the one or more LEDs.

2. The LED apparatus of claim 1, wherein the opaque encapsulant comprises a dark, white, or black material.

3. The LED apparatus of claim 1, wherein the opaque encapsulant comprises a red-passing pigment.

4. The LED apparatus of claim 1, further comprising one or more color-filtering regions disposed on at least a portion of the first side or the second side of the light-transmissive layer and/or on the wavelength-conversion material.

5. The LED apparatus of claim 4, comprising one or more non-reflective masking regions disposed at least partially on and/or between the one or more color-filtering regions.

6. The LED apparatus of claim 4, further comprising a protective layer disposed on the color-filtering region or on the wavelength-conversion material.

7. The LED apparatus of claim 1, wherein the first recess is formed through an entire thickness of the light-transmissive layer, from the first side to the second side of the light-transmissive layer.

8. The LED apparatus of claim 4, wherein the one or more color-filtering regions is a plurality of color-filtering regions comprising one or more blue regions, one or more green regions, and one or more red regions, the LED apparatus comprising an opaque material applied at an intersection of color-filtering regions in which different colors are filtered, the opaque material being configured to prevent color bleed between the one or more LEDs and/or to reduce overall reflection of the LED apparatus for improved contrast.

9. The LED apparatus of claim 1, wherein an intermediate coating is disposed between the wavelength-conversion material and the light-transmissive layer.

10. The LED apparatus of claim 1, comprising a protective layer disposed on the second side of the light-transmissive layer.

11. The LED apparatus of claim 1, comprising one or more layers of electrical traces disposed on a bottom surface of the one or more LEDs, opposite the light-transmissive layer.

12. The LED apparatus of claim 1, comprising an electrically conductive element interposed between the one or more LEDs and a first layer of electrical traces.

13. The LED apparatus of claim 11, comprising a solder mask disposed on at least one of the one or more layers of electrical traces.

14. The LED apparatus of claim 1, wherein the one or more LEDs is an array of LEDs configured to provide a red-green-blue (RGB) color array of light.

15. The LED apparatus of claim 14, wherein the array of LEDs consists of blue LEDs.

16. The LED apparatus of claim 14, wherein the array of LEDs consists of blue and green LEDs.

17. A light emitting diode (LED) display device comprising a plurality of LED apparatuses according to claim 1, wherein the LED apparatuses are supported by a primary mounting structure and arranged in a matrix of at least 32×32 or more, and wherein the primary mounting structure is devoid of other electronic semiconductor devices.

18. A method of producing a light-emitting diode (LED) apparatus, the method comprising:
providing a light-transmissive layer having a first side and a second side;
forming one or more recesses in the first side of the light-transmissive layer;
disposing a wavelength-conversion material to form one or more regions of the light-conversion material in at least a portion of the light-transmissive layer;
attaching one or more LEDs to the first side of the light-transmissive layer such that light emitted from the one or more LEDs passes through the wavelength-conversion material; and
applying an opaque encapsulant around and between the one or more LEDs;
wherein at least a portion of a first recess of the one or more recesses is formed directly over a first LED of the one or more LEDs; and
wherein at least a first region of the wavelength-conversion material is disposed within the first recess, such that the first region of the wavelength-conversion material is in direct contact with one of the one or more LEDs.

19. The method of claim 18, comprising, after attaching the one or more LEDs, applying electrically conductive elements to electrical contact surfaces of the one or more LEDs, wherein the encapsulant is applied after the electrically conductive elements are applied to the one or more LEDs.

20. The method of claim 18, wherein applying the encapsulant surrounding the one or more LEDs comprises applying the encapsulant to the first side of the light-transmissive layer.

21. The method of claim 18, comprising applying an intermediate coating to the first side of the light-transmissive layer prior to disposing the wavelength-conversion material in the first side of the light-transmissive layer.

22. The method of claim 21, wherein the intermediate coating is a black or red color.

23. The method of claim 21, comprising, after applying the intermediate coating, planarizing the first side of the light-transmissive layer to remove a portion of the intermediate coating.

24. The method of claim 18, comprising applying a color filtering material on at least a portion of the light-transmissive layer and/or the wavelength-conversion material.

25. The method of claim 24, wherein applying the color filtering material comprises planarizing the second surface of the light-transmissive layer and applying one or more colors on the second side of the light-transmissive layer.

26. The method of claim 25, wherein the one or more colors are applied in multiple steps.

27. The method of claim 24, comprising disposing a protective layer on the color filtering material.

28. The method of claim 18, comprising planarizing the second side of the light-transmissive layer to remove a portion of the light-transmissive layer and expose the wavelength-conversion material.

29. The method of claim 18, comprising disposing a protective layer on the second side of the light-transmissive layer.

30. The method of claim 19, comprising:
planarizing the encapsulant to expose at least a portion of the electrically conductive elements; and/or
applying one or more layers of electrical traces over the electrically conductive elements.

31. The method of claim 30, comprising applying a solder mask to at least a portion of outermost electrical traces of the one or more layers of electrical traces.

32. The method of claim 18, comprising separating the LED apparatus into multiple portions, each of the multiple portions comprising a plurality of LEDs.

33. A light emitting diode (LED) apparatus comprising:
a light-transmissive layer having a first side and a second side;
one or more regions of a color-filtering material disposed on the light-transmissive layer;
a plurality of LEDs disposed on the first side of the light-transmissive layer, such that light emitted from the plurality of LEDs can pass through the color-filtering material;
a protective layer disposed over the one or more regions of the color-filtering material and on the second side of the light-transmissive layer, the protective layer comprising recesses formed in a surface thereof that is nearest to the one or more regions of the color-filtering material, wherein the recesses are respectively aligned with at least one edge of the one or more regions of the color-filtering material;
an opaque material disposed within each of the recesses; and
an opaque encapsulant disposed around and between the plurality of LEDs.

34. The method of claim 18, wherein the first recess is formed through an entire thickness of the light-transmissive layer, from the first side to the second side of the light-transmissive layer.

35. A light emitting diode (LED) apparatus comprising:
a plurality of LEDs;
one or more encapsulating layers disposed around and between the plurality of LEDs; and
a color-filtering layer;
wherein the color-filtering layer is 50 μm or less in thickness; and
wherein the color-filtering layer is disposed on, or at least partially within, the one or more encapsulating layers and between the plurality of LEDs and the one or more encapsulating layers.

* * * * *